United States Patent [19]

Laugesen et al.

[11] 4,048,524
[45] Sept. 13, 1977

[54] MOS VOLTAGE LEVEL DETECTING AND INDICATING APPARATUS

[75] Inventors: Ronald C. Laugesen, Sunnyvale; Mark Shin-Dong Shieu, San Jose, both of Calif.

[73] Assignee: National Semiconductor Corporation, Santa Clara, Calif.

[21] Appl. No.: 679,120

[22] Filed: Apr. 21, 1976

[51] Int. Cl.$^2$ .................... H03K 5/153; H03K 3/295; H03K 3/353; H03K 17/30

[52] U.S. Cl. ................................. 307/304; 307/360; 307/251; 307/279; 307/290; 328/150

[58] Field of Search ............... 307/205, 235 N, 235 R, 307/235 T, 235 W, 279, 290, 296, 304, 251; 328/150

[56] References Cited

U.S. PATENT DOCUMENTS

| | | | |
|---|---|---|---|
| 3,609,411 | 9/1971 | Ma et al. | 307/235 N X |
| 3,612,908 | 10/1971 | Heimbigner | 307/279 |
| 3,697,777 | 10/1972 | Donoghue | 307/304 X |
| 3,851,189 | 11/1974 | Moyer | 307/279 |
| 3,984,703 | 10/1976 | Jorgensen | 307/279 |

Primary Examiner—John S. Heyman
Assistant Examiner—Larry N. Anagnos
Attorney, Agent, or Firm—Gail W. Woodward; Willis E. Higgins

[57] ABSTRACT

In a MOS integrated circuit, a voltage level detecting and indicating circuit apparatus is provided. In the apparatus there is provided a MOS integrated circuit means responsive to a change in the magnitude of a voltage in the circuit. In the circuit means there is provided a first node at which occurs a first signal when the magnitude of the voltage is changed to a first predetermined magnitude, said occurrence of said first signal being independent of at least one of a plurality of process variables including threshold voltage, mobility, body effect factor and lateral diffusion within a predetermined range of magnitude of said variable, and a second node at which occurs a second signal when said magnitude of said voltage is changed to a second predetermined magnitude and a third signal when said magnitude of said voltage is changed to the third predetermined magnitude, said occurrence of said second and third signals being dependent on at least one of said plurality of process variables.

3 Claims, 1 Drawing Figure

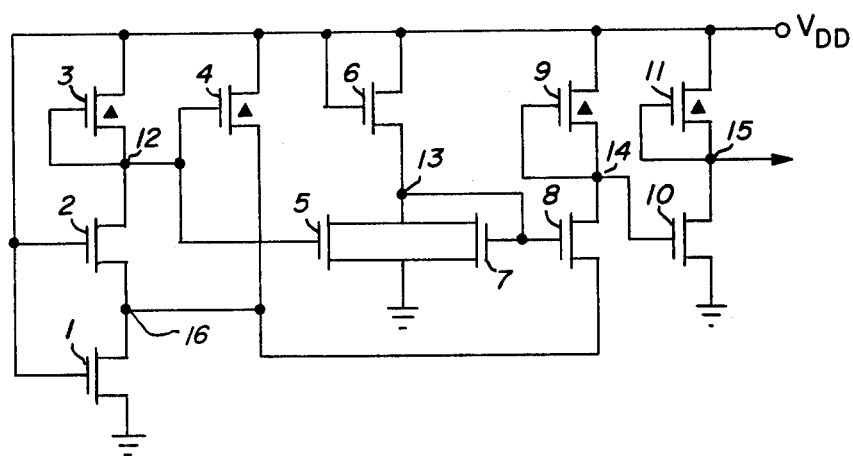

MOS VOLTAGE LEVEL DETECTING AND INDICATING APPARATUS

BACKGROUND OF THE DISCLOSURE

The present invention relates to voltage level detecting and indicating circuit apparatus in general and in particular to a MOS voltage level detecting and indicating circuit apparatus for detecting and indicating a voltage level in a MOS integrated circuit.

MOS circuits are widely used in small portable electronic calculating apparatus which utilize light-emitting diodes (LED's) for output display. To insure against marginal operation, the calculators are typically provided with a low supply voltage indicator. However, because of the current requirements for driving a LED display, it had been the practice to include as an interface between the MOS calculator chip and the LED display a bipolar LED digit driver circuit, and because of a lack, heretofore, of suitable MOS voltage level detecting apparatus, the digit driver circuit typically included a voltage level detecting and indicating circuit which was coupled to at least one element of the display for providing a visual indication when the magnitude of the supply voltage (i.e., battery) became less than a predetermined level below which the calculator would not operate reliably.

Among the disadvantages of using a separate bipolar digit driver and low voltage indicating circuit are the cost of a separate integrated circuit, the space required to house the circuit and the fixed level of the supply voltage at which the bipolar voltage level detecting and indicating portion of the driver circuit operates. Because of the fixed operating level of the prior known voltage level detecting and indicating circuits as used in the bipolar digit driver circuits, manufacturers of MOS electronic calculators have, heretofore, generally been required to discard all MOS chips which would not operate or would become marginally operable at voltage supplies below the fixed level.

Recently MOS circuits capable of handling the higher current requirements of LED circuits have become economical. With the advent of these higher current handling capabilities using MOS devices, it becomes desirable to eliminate the bipolar digit driver circuit altogether including the voltage level detecting and indicating circuit with which it has been associated. In doing so, various considerations, including the dependability of voltage levels on process variables, become important.

SUMMARY OF THE INVENTION

In view of the foregoing, a principal object of the present invention is a MOS integrated circuit means for detecting the magnitude of a voltage and indicating when said magnitude of said voltage is a predetermined magnitude.

A further object of the present invention is to provide on a MOS chip a low power supply detector and indicator which is powered by the voltage supply it is monitoring and which will extend the battery life by providing a low supply detection and indication which, in one part of the circuit, is independent of process variables of the MOS device within predetermined limits, and which, in another part of the circuit, tracks the process variables.

A feature of the present invention is a circuit consisting of basically a Schmitt trigger, the output of which changes from a high value (approximately $V_{ss} - 0.5$ volts) to a low value ($V_{ss} - V_{DD}$) when the supply voltage ($V_{ss} - V_{DD}$) is reduced to a specific value. The value of the supply ($V_{ss} - V_{DD}$) where the output of the Schmitt trigger toggles is a function of the MOS design and process variables. The trip point tracks these variables directly — i.e., for those chips which have low thresholds and high Beta (mobility) — a lower power supply can be tolerated and the MOS device will still function properly and for these same process variables the "low supply indicator" will trip at a lower supply voltage, thus allowing flexibility in allowing a lower supply voltage before giving a "low supply indication." Similarly, higher threshold, low mobility processed parts require a higher minimum operating supply and the "low supply indicator" trip point shifts occur at a proportionately higher ($|V_{ss} - V_{DD}|$) level.

By tripping at a lower power level, the voltage level detecting and indicating circuit apparatus of the present invention allows the use of a battery to a lower level than heretofore possible using a bipolar fixed-level detecting circuit, thus effectively enhancing battery life. Also, yield is enhanced since the minimum $V_{DD}$ operating value is allowed to vary rather than being fixed to match some worst case condition which heretofore has been determined by independently varying external components.

A second feature of the present invention is the availability of a node at which occurs a signal when the magnitude of the supply voltage reaches a predetermined magnitude but which occurrence is independent of at least one of a plurality of process variables including threshold voltage, Beta (mobility), body effect factor and lateral diffusion within a predetermined range of magnitude of said variables.

It is clear that by means of the second feature, the MOS circuit design engineer is provided with a means for obtaining in a MOS circuit a signal dependent on a fixed voltage level independent of process variables. This should provide considerable advantages to the engineer designing other circuits.

DESCRIPTION OF THE DRAWING

The above and other objects, features and advantages of the present invention will be apparent from the detailed description of the accompanying drawing which comprises a schematic of a preferred embodiment of the present invention.

DETAILED DESCRIPTION

Referring to the drawing, there is provided a PMOS enhancement device 1 having one of its drain-source leads coupled to ground and the other of its drain-source leads coupled to one of the drain-source leads of a second PMOS enhancement device 2. The second source-drain lead of PMOS device 2 is coupled to one of the source-drain leads of a PMOS depletion device 3. The other of the source-drain leads of PMOS device 3 is coupled to a supply voltage line $V_{DD}$.

The point of interconnection between the devices 2 and 3 is designated node 12. The gate of device 3 is coupled to node 12. The point of interconnection between the devices 1 and 2 is designated node 16. The gates of devices 1 and 2 are connected in parallel to the voltage supply line $V_{DD}$.

Coupled to node 12 are the gates of a PMOS depletion device 4 and a PMOS enhancement device 5. Coupled to the node 16 are one of the source-drain leads of the device 4 and one of the source-drain leads of a PMOS enhancement device 8. The other of the source-drain leads of device 4 is coupled to the voltage supply line $V_{DD}$.

One of the source-drain leads of the device 5 is coupled to one of the source-drain leads of a PMOS enhancement device 7 and to ground. The other of the source-drain leads of device 5 is coupled to the other of the source-drain leads of the device 7 and to one of the source-drain leads of a PMOS enhancement device 6. The other of the source-drain leads of the device 6 is coupled to the voltage supply line $V_{DD}$ and to the device 6 gate. The line interconnecting the devices 5 and 7 to the device 6 is designated node 13. Node 13 is connected to the gate of the device 7 and to the gate of the device 8. The other of the source-drain leads of the device 8 is connected to one of the source-drain leads of a PMOS depletion device 9. The other of the source-drain leads of the device 9 is connected to the voltage supply line $V_{DD}$. The line interconnecting the devices 8 and 9 is designated node 14. The gate of device 9 is coupled to node 14.

Node 14 is coupled to the gate of a PMOS enhancement device 10. One of the source-drain leads of the device 10 is coupled to ground. The other of the source-drain leads of the device 10 is coupled to one of the source-drain leads of a PMOS depletion device 11. The other of the source-drain leads of the device 11 is coupled to the voltage supply line $V_{DD}$. The line interconnecting the devices 10 and 11 is designated node 15. The gate of device 11 is coupled to the node 15.

In one embodiment of the present invention the width and length of the channels in conventional units of the above described PMOS devices are as follows:

| Device | Width (Mils) | Length (Mils) |
|---|---|---|
| 1 | 0.8 | 1.0 |
| 2 | 0.5 | 0.9 |
| 3 | 0.3 | 4.0 |
| 4 | 0.6 | 1.9 |
| 5 | 1.2 | 1.0 |
| 6 | 0.3 | 1.0 |
| 7 | 0.3 | 5.0 |
| 8 | 9.3 | 0.7 |
| 9 | 0.3 | 5.0 |
| 10 | 1.2 | 1.0 |
| 11 | 0.3 | 3.0 |

With the above width and length dimensions and the PMOS enhancement device having a threshold voltage of −2 volts, a body effect factor of −0.85, a lateral diffusion of 0.08 mils, and a Beta of 4.3u MHOS/V also with the PMOS depletion device having a threshold voltage of 4.2 volts, a body factor of −0.85, a lateral diffusion of 0.08 mils and a Beta of 4.3u MHOS/V, the operation of the apparatus was simulated.

In the simulation, the supply voltage $V_{DD}$ was decreased from − 0.5 volts to −7.50 volts in −0.1 volt increment and then increased to − 0.5 volts in 0.1 volt increments. During the change of the supply voltage $V_{DD}$, the voltage at the nodes 16, 12, 13, 14 and 15 was plotted. As the voltage changed from − 0.5 volts to −7.5 volts, the voltage at node 12 decreased linearly until $V_{DD}$ equalled approximately −5.7 volts. When $V_{DD}$ equalled −5.7 volts the voltage at node 12 rose sharply from approximately −5.7 volts to −1.20 volts. When the voltage $V_{DD}$ reached −6.80 volts, the voltage at node 15 changed sharply from − 0.16 volts to −6.8 volts. As the voltage $V_{DD}$ decreased further to a maximum of −7.50 volts, the voltage at node 15 also decreased to −7.50 volts.

After the supply voltage $V_{DD}$ reached −7.5 volts the voltage was increased positively in increments of 0.1 volts. When the voltage $V_{DD}$ reached −6.80 volts, the voltage at node 15 changed sharply from −6.8 volts to − 0.16 volts. It may be noted at this point that the sharp voltage change at node 15, which has been described as occurring when the voltage supply $V_{DD}$ was at −6.80 volts occurred irrespective of the polarity of the slope of the change in supply voltage.

Continuing with the description of the simulation, as the voltage $V_{DD}$ was increased still further, a sharp change in the voltage at node 12 occurred in which the voltage at node 12 changed from approximately −5.04 volts to −1.60 volts when the voltage $V_{DD}$ reached −5.20 volts. It may be noted that this change in voltage at node 12 occurred at a different and higher value of $V_{DD}$ from that described above. This difference in trip point may be used to advantage in circuits requiring a hysteresis-type signal response.

In a second simulation using device models having the same width and length as the devices described above but with the PMOS enhancement devices having a threshold voltage of −1.2 volts, a body effect factor of − 0.5, a lateral diffusion of 0.16 mils, and a Beta of 8.7u MHOS/V, and with the PMOS depletion device having a threshold voltage of +5.9 volts, a body factor of − 0.5, a lateral diffusion of 0.16 mils, and a Beta of 8.7u MHOS/V, it was discovered that while the voltage level at node 15 changed sharply between − 0.24 volts and −6.64 volts at voltages of $V_{DD}$ of −6.8 volts, which is substantially identical to the changes in voltage level at node 15 with respect to the simulation described above, the voltage level at node 12 made sharp transitions between −3.28 volts and −3.84 volts at voltages of $V_{DD}$ of −5.10 volts.

In comparing the voltages $V_{DD}$ at which the voltage at node 12 transitioned sharply, it is seen that the transition at node 12 occurred at a lower supply voltage $V_{DD}$ for a chip having a relatively low threshold and high mobility than it did, as shown in the first simulation described above when the threshold voltage was higher. This indicates that a lower power supply voltage level can be tolerated and the MOS device will still function properly and that for the same process variables the "low supply indicator" will trip at a lower supply voltage, thus allowing flexibility and allowing a lower supply voltage for giving a "low supply indicator" signal.

Referring again to the first simulation description, it will be noticed that the voltage $V_{DD}$ at which the voltage transition at node 12 occurred, occurred at different values of $V_{DD}$ depending upon the polarity of the slope of the change of the voltage $V_{DD}$. That is to say, the transition at node 12 occurred at a lower or more negative voltage $V_{DD}$ when the voltage $V_{DD}$ was changing in a more positive direction, the values being −5.70 volts and −5.20 volts, respectively. This difference in the trip point of the node 12 may be used to advantage as described above in circuits requiring a hysteresis-type signal response and, accordingly, the voltage at node 12 may be used to advantage, for example, in noisy circuits for activating circuit elements without subjecting them to erroneous activation on account of noise.

While the present invention is contemplated to be used principally in MOS calculators and as part of a calculator chip circuit for detecting and providing an indication of low voltage levels, it is apparent from the foregoing that the apparatus may be used in other application. It is also contemplated that the specific length and width of the various circuit devices may be changed to provide different trip points and toggling at voltages other than those described herein. Thus, while an apparatus has been described for providing in a MOS circuit a signal which is independent of threshold voltage, mobility, body effect factor and lateral diffusion, within predetermined limits as well as a signal which is dependent on said process variables, the specific details and circuit device parameters may be varied to suit particular applications. It is intended, therefore, that the embodiments described herein and the suggested changes thereto be taken as illustrative only and that the scope and spirit of the invention be determined not by reference thereto alone but by reference to the claims hereinafter provided.

What is claimed is:

1. In a MOS integrated circuit, a voltage level detecting and indicating circuit apparatus comprising: MOS integrated circuit means responsive to a change in the magnitude of a voltage in said circuit having a first node at which occurs a first signal when said magnitude of said voltage is changed to a first predetermined magnitude, said occurrence of said first signal being independent of at least one of a plurality of process variables including threshold voltage, mobility, body effect factor and lateral diffusion within a predetermined range of magnitude of said variable, and a second node at which occurs a second signal when said magnitude of said voltage is changed to a second predetermined magnitude and a third signal when said magnitude of said voltage is changed to a third predetermined magnitude, said occurrence of said second and third signals being dependent on at least one of said plurality of process variables.

2. An apparatus according to claim 1 wherein said second and third signals at said second node occur at different magnitudes depending upon the direction of change of said voltage thereby providing a hysteresis-like output.

3. The apparatus of claim 1 wherein said voltage is the voltage applied to power said circuit and said signals function to indicate when said voltage is below predetermined levels.

* * * * *